United States Patent
Zhong et al.

(10) Patent No.: US 8,637,935 B2
(45) Date of Patent: Jan. 28, 2014

(54) SEMICONDUCTOR DEVICE INCLUDING EMBEDDED ISOLATION REGIONS AND METHOD FOR FORMING THE SAME

(75) Inventors: Huicai Zhong, San Jose, CA (US); Qingqing Liang, New York, NY (US); Haizhou Yin, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/266,555

(22) PCT Filed: Apr. 19, 2011

(86) PCT No.: PCT/CN2011/000684
§ 371 (c)(1),
(2), (4) Date: Oct. 27, 2011

(87) PCT Pub. No.: WO2011/160422
PCT Pub. Date: Dec. 29, 2011

(65) Prior Publication Data
US 2012/0187496 A1 Jul. 26, 2012

(30) Foreign Application Priority Data
Jun. 22, 2010 (CN) .......................... 2010 1 0215165

(51) Int. Cl.
*H01L 29/76* (2006.01)
*H01L 21/8238* (2006.01)

(52) U.S. Cl.
USPC .................. 257/374; 257/396; 257/E21.545; 257/E29.264; 438/221; 438/424

(58) Field of Classification Search
USPC ............ 257/368, 374, 396, E29.264, E21.43, 257/E21.545; 438/197, 221, 300, 424, 430
See application file for complete search history.

(56) References Cited

U.S. PATENT DOCUMENTS

| 6,780,691 B2 * | 8/2004 | Cha et al. ....................... 438/161 |
| 7,306,997 B2 * | 12/2007 | Xiang et al. .................. 438/300 |
| 7,566,605 B2 * | 7/2009 | Shifren et al. ................ 438/199 |
| 2002/0025631 A1 | 2/2002 | Bez et al. |
| 2004/0076050 A1 | 4/2004 | Hsieh |
| 2008/0311719 A1 * | 12/2008 | Tang et al. .................... 438/300 |

FOREIGN PATENT DOCUMENTS

KR 20030002352 A 1/2003

OTHER PUBLICATIONS

International Search Report PCT/CN2011/000684 , dated Jul. 21, 2011.

* cited by examiner

Primary Examiner — Tuan N. Quach
(74) Attorney, Agent, or Firm — Troutman Sanders LLP (57) ABSTRACT

A method for forming a semiconductor device comprises: forming at least one gate stack structure and an interlayer material layer between the gate stack structures on a semiconductor substrate; defining isolation regions and removing a portion of the interlayer material layer and a portion of the semiconductor substrate which has a certain height in the regions, so as to form trenches; removing portions of the semiconductor substrate which carry the gate stack structures, in the regions; and filling the trenches with an insulating material. A semiconductor device is also provided. The area of the isolation regions may be reduced.

14 Claims, 10 Drawing Sheets

Fig. 36

SEMICONDUCTOR DEVICE INCLUDING EMBEDDED ISOLATION REGIONS AND METHOD FOR FORMING THE SAME

CLAIM OF PRIORITY RIGHT

This application is a Section 371 National Stage Application of International Application No. PCT/CN2011/000684, filed on Apr. 19, 2011, which claims priority to Chinese Application No. CN 201010215165.2, filed on Jun. 22, 2010, the entire content of which is incorporated herein by reference in its entirety.

FIELD OF THE INVENTION

The present invention relates to the technical field of semiconductor and, more specifically, to a semiconductor device and a method for forming the same.

BACKGROUND OF THE INVENTION

Figure 1:
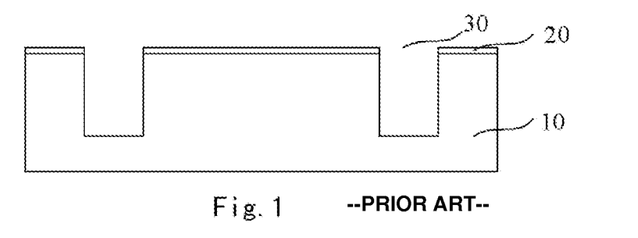
FIGS. 1-3 are schematic views of intermediate structures in respective steps of a method for forming a semiconductor device in the prior art.
Figure 2:
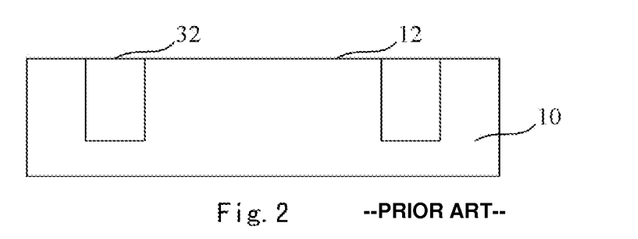
Figure 3:
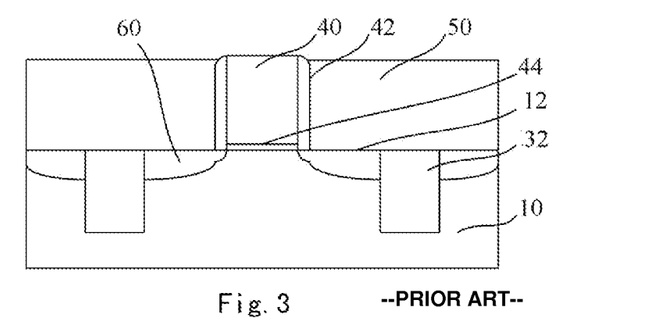

In the prior art, the method for forming a semiconductor device comprises: first, as shown in FIG. 1, forming a trench 30 in a semiconductor substrate 10 (a hard mask 20, e.g., silicon oxide may be previously formed on a surface of the semiconductor substrate 10); then, as shown in FIG. 2, filling the trench 30 with an insulating material (e.g., silicon oxide), so as to form isolation regions 32 (e.g., STIs) and an active region 12 surrounded by the isolation regions 32 in the semiconductor substrate 10; and then, as shown in FIG. 3, forming at least one gate stack structure (and source and drain regions 60) and an interlayer dielectric layer 50 (e.g., doped or undoped silicon oxide) located between the gate stack structures (including a gate dielectric layer 44, a gate electrode 40 formed on the gate dielectric layer 44, and spacers 42 surrounding the gate dielectric layer 44 and the gate electrode 40) on the active region 12. After contact holes are formed in the interlayer dielectric layer 50, the semiconductor device may be interconnected through external conductors. In other words, the gate stack structure is formed after formation of the isolation region 32.

For various considerations (e.g., cost), it is always desired in the industry to reduce the area of isolation regions so as to increase the area of the active region, such that the number of the devices formed in a unit area of the semiconductor substrate may be increased. However, various narrow effects begin to emerge with continuous reduction in the critical dimension of the semiconductor device. It becomes more difficult to reduce the area of the isolation regions due to the limitation of design rules for the semiconductor device.

SUMMARY OF THE INVENTION

To solve the above problem, the present invention provides a semiconductor device and method for forming the same, whereby the area of the isolation region may be reduced.

A method for forming a semiconductor device provided by the present invention comprises:

forming at least one gate stack structure and an interlayer material layer between the gate stack structures on a semiconductor substrate;

defining isolation regions and removing a portion of the interlayer material layer and a portion of the semiconductor substrate which has a certain height in the isolation regions, so as to form trenches;

removing portions of the semiconductor substrate which carry the gate stack structures, in the regions; and filling the trenches with an insulating material.

Optionally, the removing operation is performed by an isotropic etching process or a passivation process.

Optionally, for PMOS and NMOS devices, said interlayer material layer is made of the same material.

Optionally, the interlayer material layer is a semiconductor layer.

Optionally, the method further comprises:

forming a metal layer covering the interlayer material layer;

performing thermal processing, to convert the interlayer material layer into a conductive layer.

A method for forming a semiconductor device provided by the present invention comprises:

forming at least one gate stack structure base extending along a first direction and an interlayer material layer between the gate stack structure bases on a semiconductor substrate;

defining isolation regions and removing a portion of the interlayer material layer and a portion which has a certain height of the semiconductor substrate in the isolation regions, so as to form trenches;

removing portions of the semiconductor substrate which carry the gate stack structure bases, in the region;

filling the trenches with an insulating material;

forming gate stack structures based on the gate stack structure bases and cutting the gate stack structures along a second direction, which is different from the first direction.

Optionally, the removing operation is performed by an isotropic etching process or a passivation process.

Optionally, for PMOS and NMOS devices, the interlayer material layer is made of the same material.

Optionally, the interlayer material layer is a semiconductor layer.

Optionally, the method further comprises:

forming a metal layer covering the interlayer material layer;

performing thermal processing to convert the interlayer material layer into a conductive layer.

A semiconductor device is provided by the present invention, wherein a plurality of said semiconductor devices are isolated by isolation regions which are embedded into a semiconductor substrate. The semiconductor device comprises: an interlayer material layer and at least one gate stack structure, wherein the gate stack structures are formed on the semiconductor substrate, and portions of the gate stack structures are located on the isolation regions, and wherein the upper surface of the gate stack structures at the isolation regions is lower than the upper surface of the gate stack structures between the isolation regions, and the interlayer material layer is located between the gate stack structures.

Optionally, the interlayer material layer is formed on the upper surface of the gate stack structures on the isolation regions.

Optionally, for PMOS and NMOS devices, the interlayer material layer is made of the same material.

Optionally, the interlayer material layer is a semiconductor layer or a conductive layer.

As compared with the prior art, the following advantages can be achieved by using the technical solution provided in the present invention.

Since the minimum size required by the design rules is greater than the minimum size allowed in the process of exposing, etching etc., by forming isolation regions after beginning to form gate stack structures, the precision advantages of the process of exposing, etching etc. are fully used to form the trenched, and then form the isolation regions, thus the area of the isolation regions may be reduced.

By using a semiconductor layer as the interlayer material layer, forming a metal layer on the semiconductor layer, and forming the conductive layer after the thermal processing operation, the conductive layer may be used as contact holes, which is advantageous to simplify the process.

BRIEF DESCRIPTION OF THE DRAWINGS

The sectional views in the following FIGS. 4-21 are obtained by cutting the formed structures along lines AA' in corresponding top-down views.

DETAILED DESCRIPTION OF THE INVENTION

The following disclosure provides various embodiments or examples for implementing the technical solution provided by the present invention. Although components and configurations of specific examples are described in the following, they are merely examples and are not intended to limit the present invention.

In addition, reference numbers and/or letters can be repeated in different embodiments in the present invention for the purpose of concision and clarity. However, such repetition does not indicate the relationship between various embodiments and/or configurations that are discussed.

The present invention provides examples of various specific processes and/or materials, but substitution of other processes and/or other materials occurred to those skilled in the art is apparently within the protection scope of the present invention. It shall be noted that the boundaries of various regions mentioned in this specification may include necessary extension that is made for the need of processing.

In a first embodiment of a method for forming a semiconductor device provided by the present invention, the method comprises the following steps.

Figure 4:
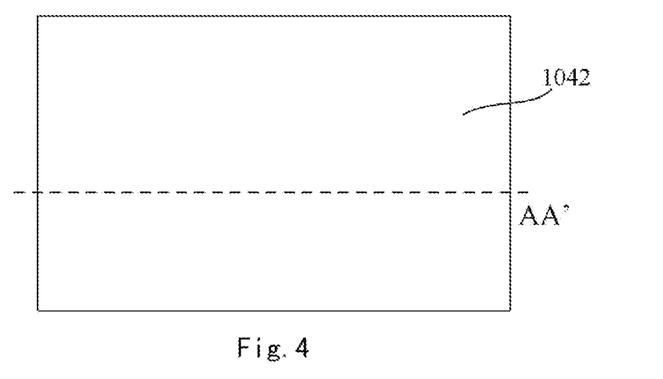
FIGS. 4 and 5 are a top-down view and a sectional view of the structures after forming material layers on a semiconductor substrate in a method for forming a semiconductor device according to an embodiment of the present invention.
Figure 5:
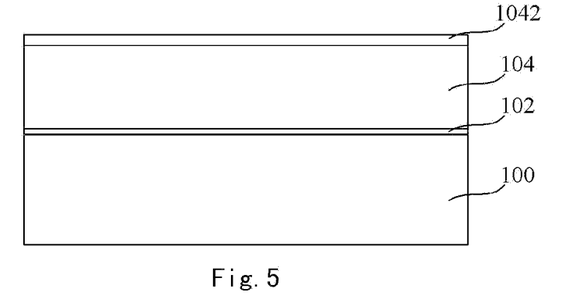

First, as shown in FIGS. 4 and 5, a gate dielectric layer 102, a gate base layer 104, and a barrier layer 1042 are sequentially deposited on a semiconductor substrate 100. The barrier layer 1042 is used as a mask layer for patterning the gate base layer 104 and gate dielectric layer 102.

In this embodiment, the semiconductor substrate 100 is a silicon substrate. While in other embodiments, the semiconductor substrate 100 may also comprise other compound semiconductors, such as SiC, GaAs, InAs, or InP. Furthermore, the semiconductor substrate 100 preferably comprises an epitaxial layer. The semiconductor substrate 100 may also comprise a Silicon on Insulator (SOI) structure. The material for the gate dielectric layer 102 may be a Hafnium-based material, such as one of $HfO_2$, HfSiO, HfSiON, HfTaO, HfTiO, and HfZrO, or any combination thereof. If the gate is formed by a gate-first process, the gate base layer 104 may be a polysilicon layer or stacked metal layers. The stacked metal layers comprise a work function metal layer, a first metal layer, and a second metal layer. The work function metal layer may comprise one of TiN, TiAlN, TaN and TaAlN, or any combination thereof. Each of the first and second metal layers may comprise one of Al, Ti, Ta, W and Cu, or any combination thereof. If the gate is formed by a gate-last process, the gate base layer 104 may be a polysilicon layer or an amorphous silicon layer. The barrier layer 1042 may be SiN.

Figure 6:
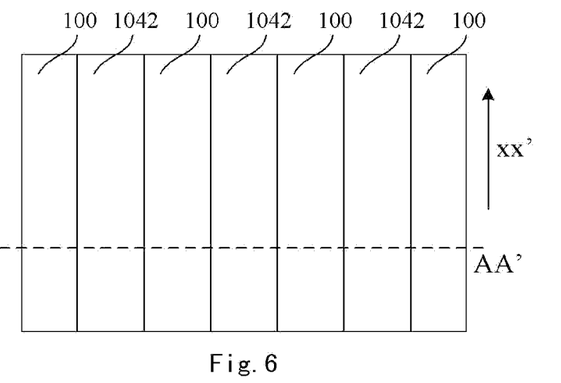
FIGS. 6 and 7 are a top-down view and a sectional view of the structures after patterning the barrier layer, the gate base layer and the gate dielectric layer in the method for forming the semiconductor device according to the embodiment of the present invention.
Figure 7:
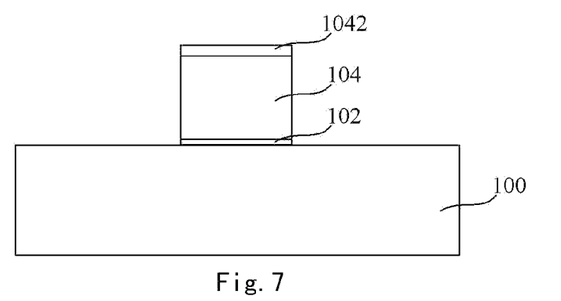

Next, as shown in FIGS. 6 and 7, the barrier layer 1042 is patterned, and then the gate base layer 104 and gate dielectric layer 102 are patterned by using the patterned barrier layer 1042 as a mask. The patterned gate base layer 104 and gate dielectric layer 102 extend along a first direction (as shown by the arrow xx' in the drawings). The patterning operation may be performed by using an etching process.

Figure 8:
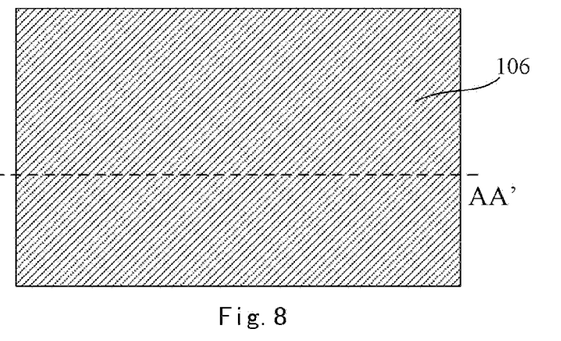
FIGS. 8 and 9 are a top-down view and a sectional view of the structures after forming the protective layer in the method for forming the semiconductor device according to the embodiment of the present invention.
Figure 9:
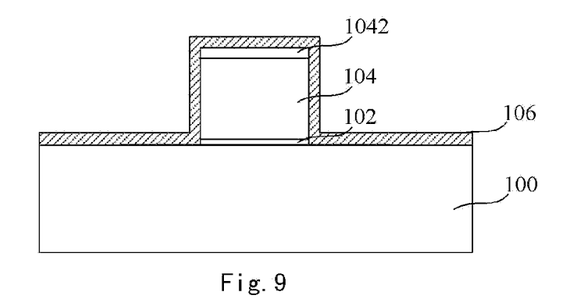

Then, as shown in FIGS. 8 and 9, a protective layer 106 is formed to cover the barrier layer 1042 and the exposed portions of both the patterned gate base layer 104 and gate dielectric layer 102. The protective layer 106 may be formed by using a deposition process. The protective layer 106 may be SiN.

Figure 10:
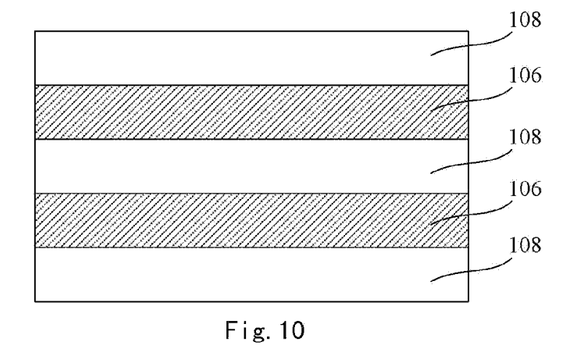
FIG. 10 is a top-down view of the structure after forming photoresist patterns in the method for forming the semiconductor device according to the embodiment of the present invention.

Then, as shown in FIG. 10, a photoresist layer 108 is formed on the protective layer 106 with a first region (e.g., a PMOS device region) being exposed. That is, a photoresist pattern is formed such that the surface of the first region is still the protective layer 106, and the surface of other regions (e.g., a second region, i.e., a NMOS device region) of the silicon substrate is covered by the photoresist layer 108.

Figure 11:
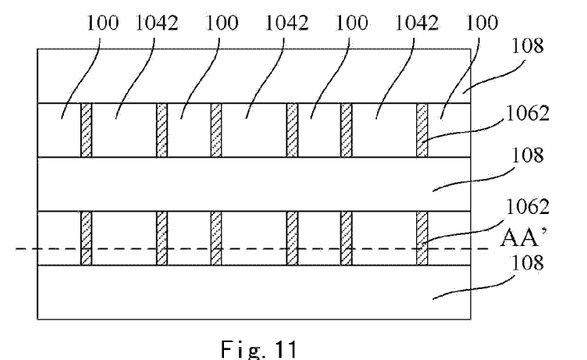
FIGS. 11 and 12 are a top-down view and a sectional view of the structures after forming the first spacer in the method for forming the semiconductor device according to the embodiment of the present invention.
Figure 12:
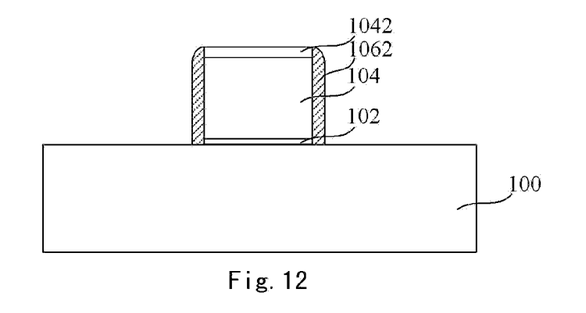

Next, as shown in FIGS. 11 and 12, the protective layer 106 is etched, and a first spacer 1062 is formed in the first region. The second region is not etched since it is covered by the photoresist layer 108. Hereto, gate stack structure bases in the first region are formed.

Figure 13:
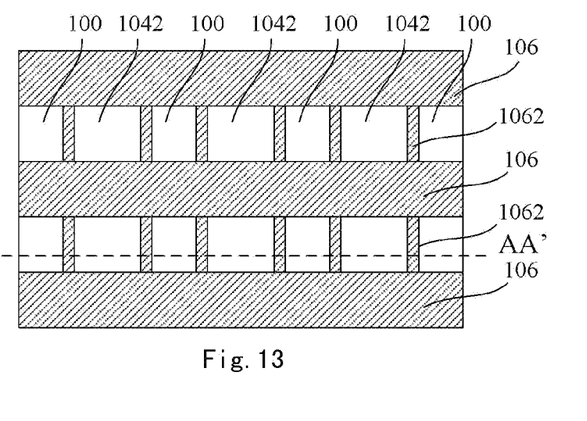
FIG. 13 is a top-down view of the structure after removing photoresist in the method for forming the semiconductor device according to the embodiment of the present invention.

Then, source and drain regions may be formed in the first region. First, as shown in FIG. 13, the photoresist layer 108 may be removed to expose the protective layer 106 covering the second region. The protective layer 106 may be used to protect the second region from being damaged when certain height of the silicon substrate in the first region is removed later, and it facilitates to reduce the residual of photoresist in the subsequent steps.

Figure 14:
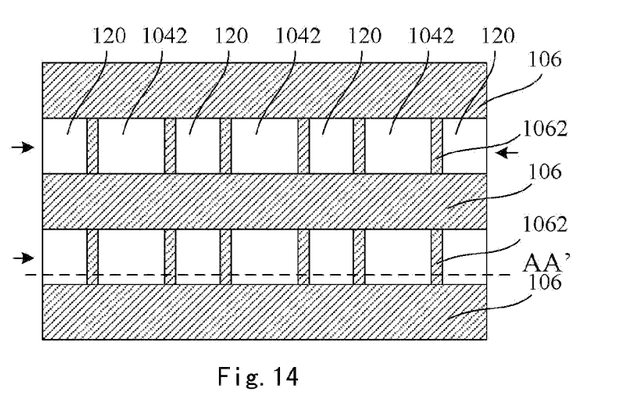
FIGS. 14 and 15 are a top-down view and a sectional view of the structures after forming the grooves in the method for forming the semiconductor device according to the embodiment of the present invention.
Figure 15:
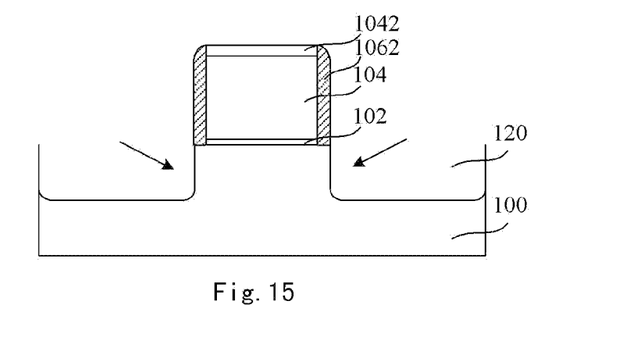

Afterwards, as shown in FIGS. 14 and 15, grooves 120 are formed within the silicon substrate in the first region. The grooves 120 are located on both sides of the gate stack structure bases and may be formed by using an etching process. Since the materials of the silicon substrate and the protective layer 106 are different, appropriate etchant may be selected such that less damage will be made to the protective layer 106 when certain height of the silicon substrate is removed. Thus, after the grooves 120 are formed, the second region is still covered by the protective layer 106. Upon formation of the grooves 120, an ion implantation operation (in the directions as shown by the arrows in the drawings) may be further performed so as to form halo regions within the silicon substrate.

Figure 16:
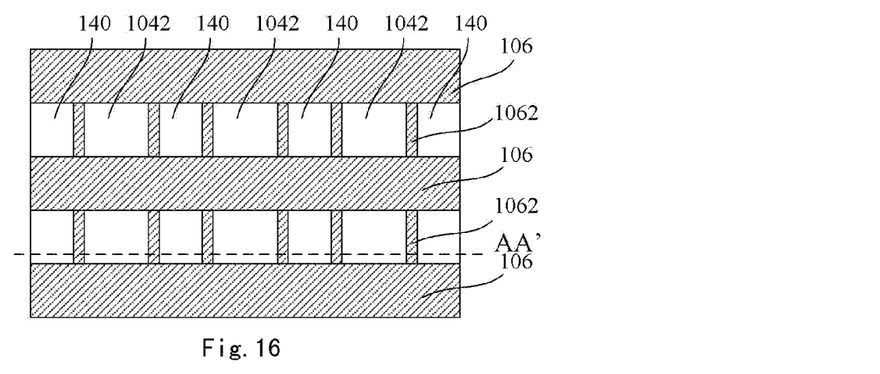
FIGS. 16 and 17 are a top-down view and a sectional view of the structures after forming the first semiconductor layer in the method for forming the semiconductor device according to the embodiment of the present invention.
Figure 17:
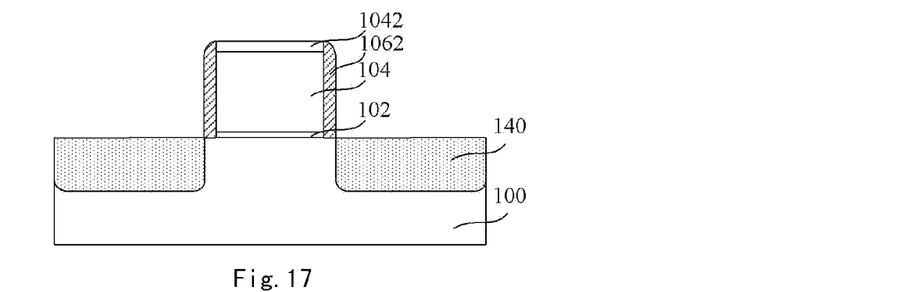

As shown in FIGS. 16 and 17, a first semiconductor layer 140 is formed in the grooves 120. The first semiconductor layer 140 may be made of a material such as Si. For a PMOS device, the first semiconductor layer 140 may also be made of $Si_{1-x}Ge_x$ (The atom percentage of Ge indicated by x, may be 40%, and the content of Ge may be flexibly adjusted according to the processing requirements. For example, x may be any value between 10%-70% and, specifically, x may be 20%, 30%, 40%, 50% or 60%. If not indicated otherwise, the atom percentage of Ge is the same as what has been provided here, and is omitted here). The first semiconductor layer 140 may be made to provide a compressive stress to the channel region of the PMOS device, so as to improve the performance of the CMOS device. The first semiconductor layer 140 may be formed by using an epitaxial method, taking the silicon substrate as the seed crystal.

It should be noted that the first semiconductor layer 140 may be ion doped semiconductor materials, such as N-type or P-type Si or $Si_{1-x}Ge_x$. The ion doping operation may be directly performed during the process of producing the first semiconductor layer 140 (e.g., doping a reactant containing component of the doped ions into the reactants for producing the first semiconductor layer 140); or the ion doping operation may be performed by an ion implantation process after producing the first semiconductor layer 140. The ion doping operation may be performed by using any conventional ion implantation process, which will be omitted here. In other embodiments, the source and drain regions may also be formed by a conventional method to perform ion implantation into the silicon substrate directly rather than a method where grooves are firstly formed and then are filled with a semiconductor material.

Figure 18:
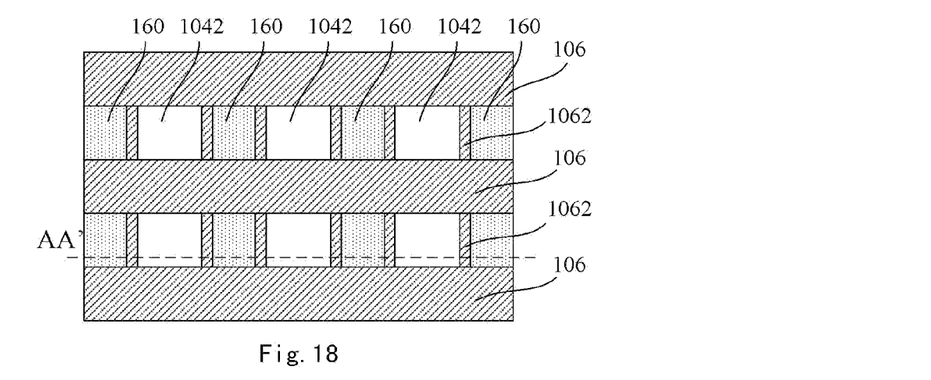
FIGS. 18 and 19 are a top-down view and a sectional view of the structures after forming the first interlayer material layer in the method for forming the semiconductor device according to the embodiment of the present invention.
Figure 19:
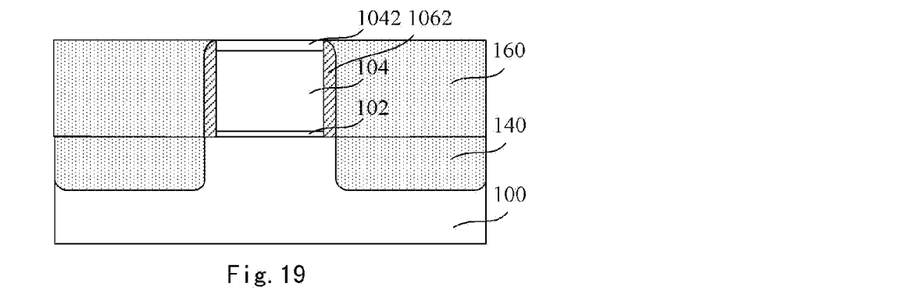

Then, as shown in FIGS. 18 and 19, a first interlayer material layer 160 between the gate stack structure bases is formed to covers the source and drain regions. In this embodiment, the first interlayer material layer 160 may be made of the same material as the first semiconductor layer 140, and may be formed by using an epitaxial method with the first semiconductor layer 140 as the seed crystal.

In other embodiments, the first interlayer material layer 160 may be a conventional interlayer dielectric layer, which may be doped or undoped silicon oxide glass (e.g. fluorosilicate glass, borosilicate glass, phosphosilicate glass, boron-phosphorosilicate glass, silicon oxycarbide, or silicon carbon oxynitride, etc.) or a dielectric material having a low dielectric constant (e.g. framesite, coral, etc.), or any combination thereof. The first interlayer material layer 160 may be formed by using Chemical Vapor Deposition (CVD), Pulse Laser Deposition (PLD), Atomic Layer Deposition (ALD), Plasma-Enhanced Atomic Layer Deposition (PEALD) or other appropriate processes. In such a case, contact holes should be formed in the first interlayer material layer 160 to enable interconnection of devices.

Figure 20:
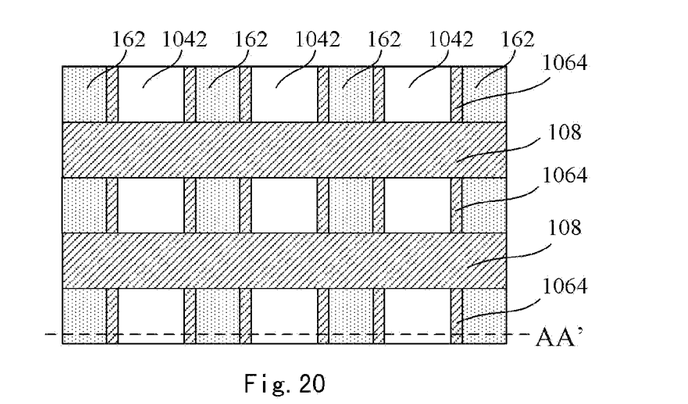
FIGS. 20 and 21 are a top-down view and a sectional view of the structures after forming the second interlayer material layer in the method for forming the semiconductor device according to the embodiment of the present invention.
Figure 21:
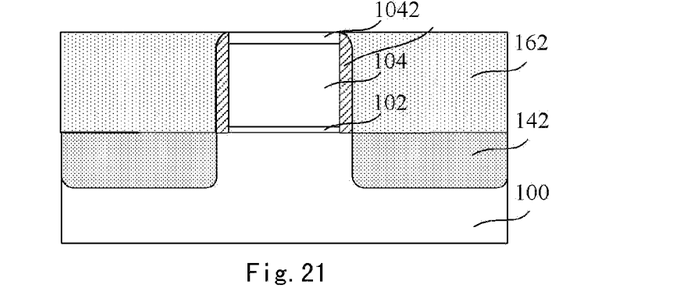

Thereafter, the photoresist layer 108 is formed on the silicon substrate that has been subjected to the above operations with the protective layer 106 in the second region being exposed (the photoresist layer 108 still remains on the first region). The protective layer 106 is etched to form a second spacer 1064 (hereto, gate stack structure bases are formed in the second region). The silicon substrate is etched with the second spacer 1064 as a mask so as to form grooves 120, and then a second semiconductor layer 142 is formed to fill the grooves 120 so as to form the source and drain regions in the second region. Then a second interlayer material layer 162 is formed between the gate stack structure bases. The structure that is formed by the above operations is shown in FIGS. 20 and 21.

The second semiconductor layer 162 may be Si or Si:C (The atom percentage of C may be 0-2%, e.g., 0.5%, 1%, or 1.5%, the content of C may be flexibly adjusted according to the processing requirements. If not indicated otherwise, the atom percentage of C is the same as what has been provided here, and is omitted). The second semiconductor layer 162 may be made to provide a tensile stress to the channel region of the NMOS device, so as to improve the performance of the CMOS device. The second semiconductor layer 162 may be formed by an epitaxial method with the silicon substrate as the seed crystal. Similar to the first semiconductor layer 160, the second semiconductor layer 162 may also be an ion doped semiconductor material, and may also be formed by an ion implantation process after producing the second semiconductor layer 162. The ion doping operation may be performed by any conventional ion implantation process, and will not be repeated. In other embodiments, the source and drain regions may also be formed by a conventional method where ion implantation is performed into the silicon substrate directly.

In this embodiment, the material of the second interlayer material layer 162 is the same as that of the second semiconductor layer 142, and may be formed by an epitaxial method with the second semiconductor layer 142 as the seed crystal.

Particularly, the first interlayer material layer 160 may be of the same material as the second interlayer material layer 162 and, for example, may be one of Si, $Si_{1-x}Ge_x$ and Si:C, which is advantageous to synchronously perform subsequent operations for the PMOS and NMOS devices.

Figure 22:
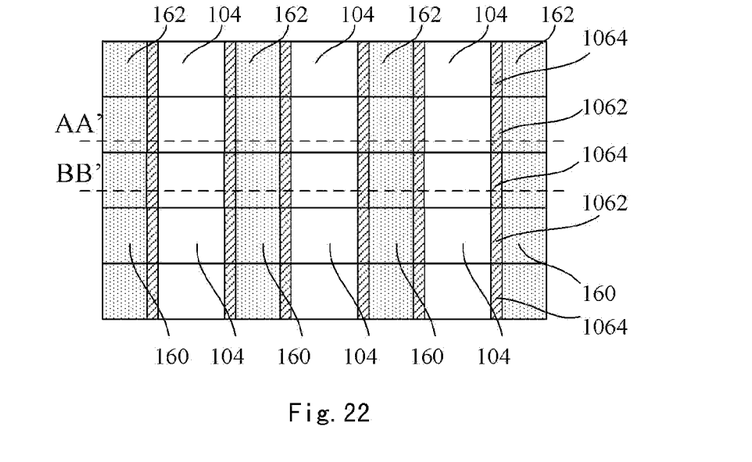
FIG. 22 is a top-down view of the structure after planarizing the interlayer material layers and removing the barrier layer in the method for forming the semiconductor device according to the embodiment of the present invention.
Figure 23:
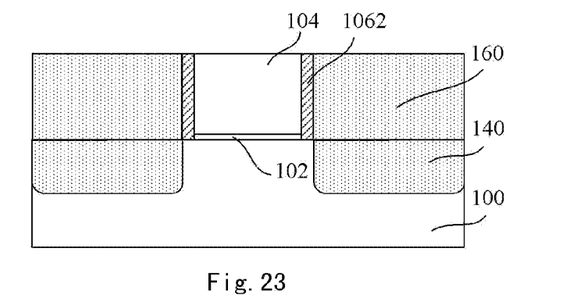
FIGS. 23 and 24 are sectional views obtained by cutting the formed structure respectively along lines AA' and BB' in FIG. 22.
Figure 24:
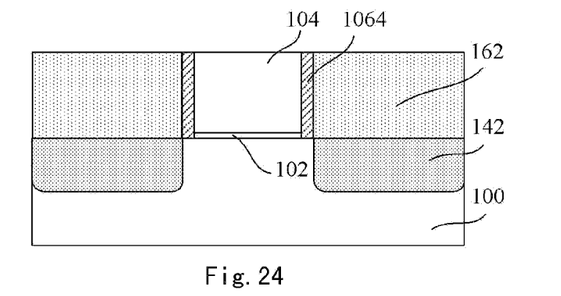
Figure 25:
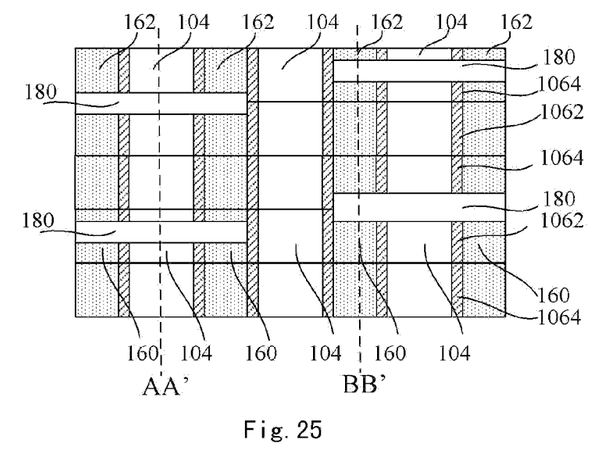
FIG. 25 is a top-down view of the structure after forming the trenches in the method for forming the semiconductor device according to the embodiment of the present invention.
Figure 26:
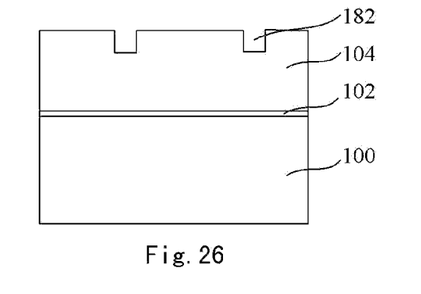
FIGS. 26 and 27 are sectional views obtained by cutting the formed structure respectively along lines AA' and BB' in FIG. 25.
Figure 27:
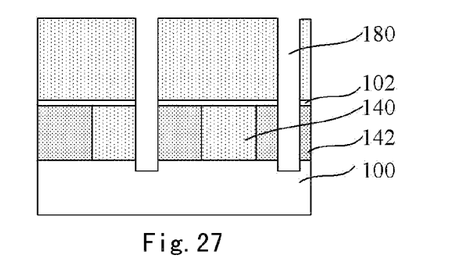
Figure 28:
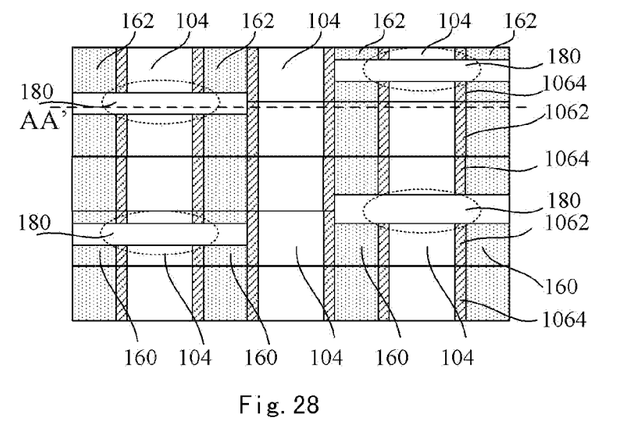
FIGS. 28 and 29 are a top-down view and a sectional view of the structures where the silicon substrate located under the gate stack structure bases in the isolation regions is not removed in the method for forming the semiconductor device according to the embodiment of the present invention.
Figure 29:
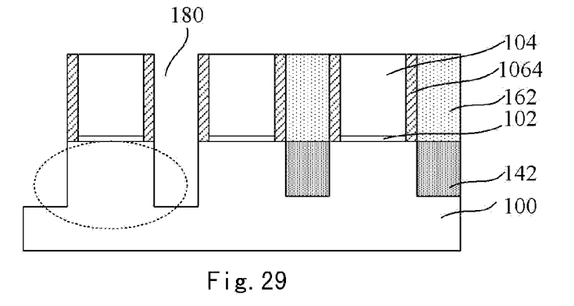
Figure 30:
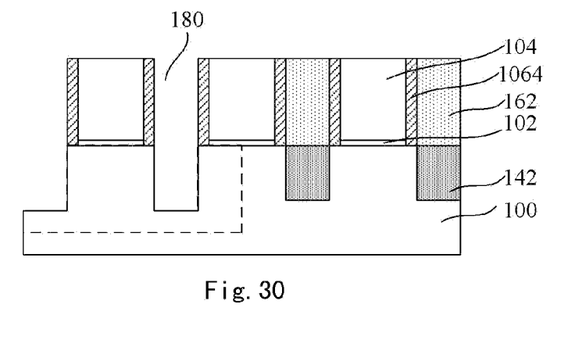
FIG. 30 is a top-down view of the structure after removing the silicon substrate located under the gate stack structure bases in the isolation regions in the method for forming the semiconductor device according to the embodiment of the present invention.
Figure 31:
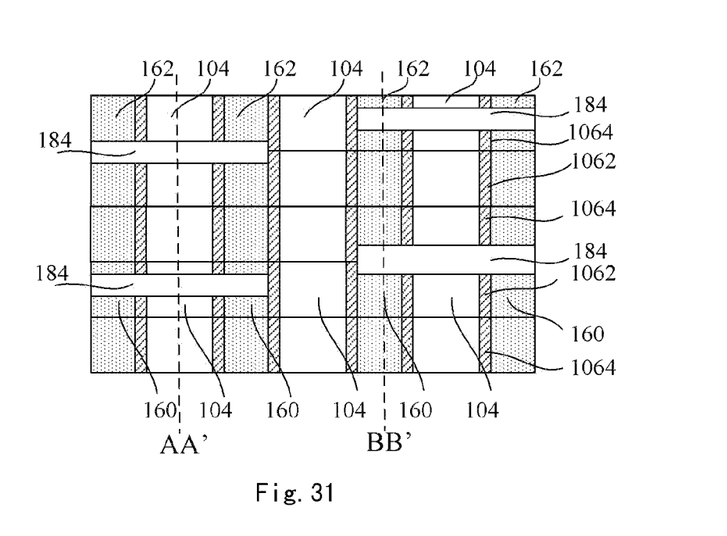
FIG. 31 is a top-down view of the structure after filling up the trenches in the method for forming the semiconductor device according to the embodiment of the present invention.
Figure 32:
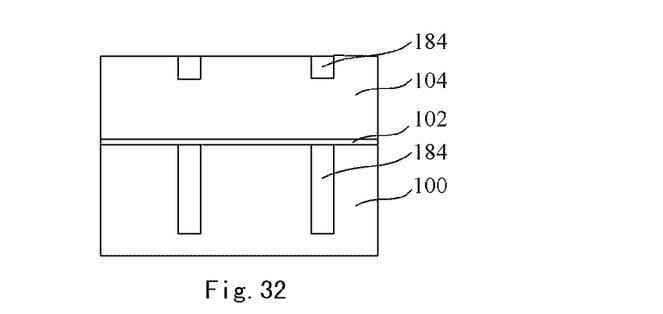
FIGS. 32 and 33 are sectional views obtained by cutting the formed structure respectively along lines AA' and BB' in FIG. 31.
Figure 33:
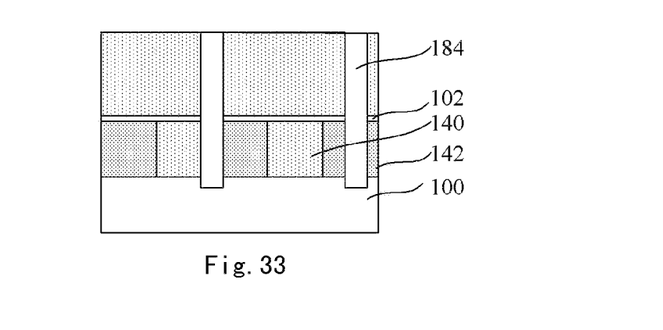

Then, as shown in FIGS. 22 to 24, the silicon substrate having the obtained structure is planarized, and the barrier layer 1042 is removed. The planarizing operation may be performed by using a Chemical Mechanical Polishing (CMP) process. If a gate-last process is employed, a dummy gate (a gate base normally made of polysilicon or amorphous silicon) may be removed to form a replacement gate (which may be stacked metal layers). Next, as shown in FIGS. 25 to 27, isolation regions are defined, and portions of both the interlayer material layers and the silicon substrate which has a certain height in the isolation regions are removed so as to form trenches 180. The trenches 180 may be formed by an etching process. Since the materials for the gate stack structure bases and the interlayer material layers 160 and 162, the semiconductor layers 140 and 142 as well as the silicon substrate are different, after the trenches 180 are formed, only part of the gate base 104 (e.g., metals) in the gate stack structure bases is removed (if a gate-last process is used, since the gate base 104 is polysilicon or amorphous silicon, which is approximately the same as that of the silicon substrate, larger part of the material is removed) to form concaves 182. However, as shown in FIGS. 28 and 29, in the isolation regions, the silicon substrate (as indicated by the dashed circle in the drawings) under the gate stack structure bases is not removed, and thus the devices that should have been isolated by the isolation regions may be conducted via the unremoved part of the silicon substrate. To achieve isolation, as shown in FIG. 30, it is needed to remove the silicon substrate carrying the gate stack structure bases in the region. The removing operation may be performed by using an isotropic etching process (e.g., when a wet etching process is used, the silicon substrate carrying the gate stack structure bases in the isolation regions is removed to form a hole, which is filled at the time when the trenches 180 are filled with an insulation material) or a passivation process (e.g., when an oxidation process is used, the silicon substrate carrying the gate stack structure bases in the isolation regions is passivated into an insulating material). After performing the removing operation, the region indicated by the dashed line is etched away or passivated into an insulating material. Afterwards, as shown in FIGS. 31 to 33, the trenches 180 are filled with an insulating material (which may be silicon oxide) to form isolation regions 184. When a gate-last process is used, a replacement gate may also be formed after formation of the isolation regions 184. Subsequently, a metal layer is formed on the first interlayer material layer 160 and the second interlayer material layer 162, and then a thermal processing operation (e.g., rapid thermal annealing) is performed such that the first interlayer material layer 160 and the second interlayer material layer 162 are converted to a conductive layer (e.g., a metal silicide layer). The conductive layer may be used as contact holes, which will be helpful to simply the process.

Figure 34:
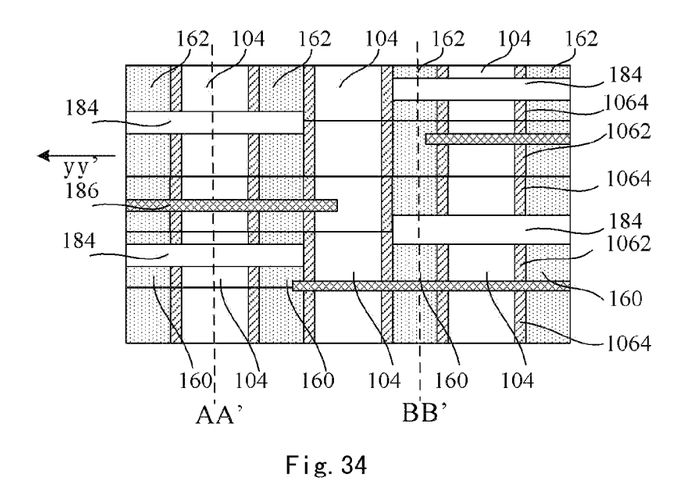
FIG. 34 is a top-down view of the structure after forming the gate stack structure in the method for forming the semiconductor device according to the embodiment of the present invention.
Figure 35:
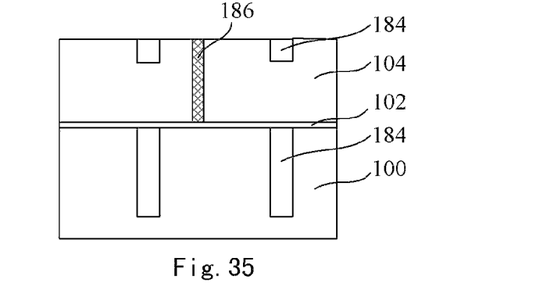
FIGS. 35 and 36 are sectional views obtained by cutting the formed structure respectively along lines AA' and BB' in FIG. 34.
Figure 36:
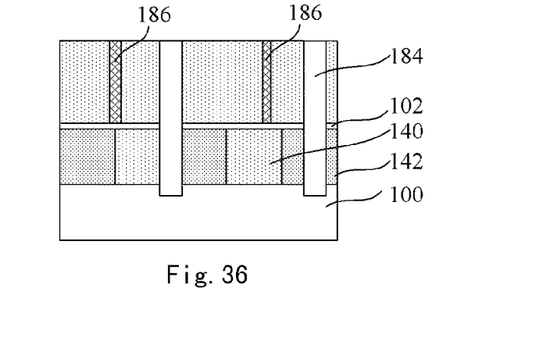

Finally, as shown in FIGS. 34 to 36, the gate stack structure bases are cut along a second direction, so as to form gate stack structures. The second direction yy' is different from the first direction (in this embodiment, the second direction is perpendicular to the first direction). The gap formed by cutting the gate stack structure bases will be filled with the material of the interlayer dielectric layer 186 subsequently.

In the above embodiments, the gate may be formed by a gate-first process or a gate-last process, and the trenched 180 may either be formed after forming the gate stack structure bases and before cutting the gate stack structure bases (in this embodiment), or be formed after cutting the gate stack structure bases (in other embodiments). At this time, the gap formed after cutting the gate stack structure bases should be filled with an insulating material before forming the trenches 180, so as to prevent the exposed silicon substrate from being removed (that is, to prevent the exposed silicon substrate from forming an insulating medium, which may change device properties). If the gate is formed by a gate-last process, the trenched 180 may either be formed after forming the dummy gate and before forming the replacement gate (in this embodiment), or be formed after forming the replacement gate and before cutting the gate stack structure bases (in other embodiments).

Furthermore, the method for forming the semiconductor device according to a second embodiment of the present invention may comprise first forming gate stack structures by a conventional processes and then forming the isolation regions. The method comprising the following steps:

first, forming at least one gate stack structure and an interlayer material layer located between the gate stack structures on a silicon substrate;

second, defining isolation regions and removing the interlayer material layer and the silicon substrate which has a certain height in the regions, so as to form trenches;

then, removing a portion of the silicon substrate carrying the gate stack structures in the regions; and finally, filling the trenches with an insulating material.

In the second embodiment for forming the semiconductor device, the trenches are formed directly after the gate stack structures are formed so as to further form the isolation regions, rather than firstly forming the gate stack structure bases and then cutting the gate stack structure bases to form the gate stack structures in the embodiment where the trenches are formed after cutting the gate stack structure bases, which may facilitate the compatibility with the conventional processes.

The present invention also provides a semiconductor device, as shown in FIG. 35. The semiconductor devices are isolated by isolation regions 184, which are embedded into a semiconductor substrate 100. The semiconductor devices comprise: an interlayer material layer and at least one gate stack structure. The gate stack structure is formed on the semiconductor substrate 100, and a part of the gate stack structure is located on the isolation region 184. The upper surface of the gate stack structure at the isolation region 184 is lower that the upper surface of the gate stack structure between the isolation regions 184. The interlayer material layer is located between the gate stack structures.

The interlayer material layer is also formed on the upper surface of the gate stack structure in the isolation region. For PMOS and NMOS devices, the interlayer material layer is made of the same material. The interlayer material layer is a semiconductor layer or a conductive layer.

In this embodiment, the semiconductor substrate is a silicon substrate, while in other embodiments, the semiconductor substrate may also comprise other compound semiconductors, such as SiC, GaAs, InAs, or InP. Furthermore, the substrate preferably comprises an epitaxial layer. The substrate may also comprise a Silicon on Insulator (SOI) structure. The gate stack structure comprises a gate dielectric layer, a gate formed on the gate dielectric layer, and spacers surrounding the gate dielectric layer and the gate. The gate dielectric layer may be made of a Hafnium-based material, such as one of $HfO_2$, HfSiO, HfSiON, HfTaO, HfSiO, and HfZrO, or any combination thereof. The gate may be a polysilicon layer or stacked metal layers, and the stacked metal layers may comprise a work function metal layer, a first metal layer, and a second metal layer. The work function metal layer may comprise one of TiN, TiAlN, TaN and TaAlN, or any combination thereof. The first metal layer and second metal layer may comprise one of Al, Ti, Ta, W and Cu, or any combination thereof. The spacer may be silicon nitride or stacked silicon nitride-silicon oxide-silicon nitride.

For a PMOS device, the material for the semiconductor layer may be Si or $Si_{1-x}Ge_x$. When being made of $Si_{1-x}Ge_x$, the semiconductor layer may apply a compressive stress to the channel region of the PMOS device, which is helpful to improve performance of the CMOS device. For an NMOS device, the semiconductor layer may be Si or Si:C. When being made of Si:C, the semiconductor layer may apply a tensile stress to the channel region of the NMOS device, which is helpful to improve performance of the CMOS device. The conductive layer may be a metal silicide layer.

In other embodiments, the first interlayer material layer may be a conventional interlayer dielectric layer, and the interlayer dielectric layer may be doped or undoped silicon oxide glass (e.g. fluorosilicate glass, borosilicate glass, phosphosilicate glass, boron-phosphorosilicate glass, silicon oxycarbide, silicon carbon oxynitride, etc.), or may be a dielectric material of low dielectric constant (e.g. framesite, coral, etc.), or any combination thereof.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same effects as those in the corresponding embodiments described in the present invention, may be applied according to the teaching of the present invention without departing from the protection scope thereof.

What is claimed is:

1. A method for forming a semiconductor device, comprising:
   forming at least one gate stack structure and an interlayer material layer between said gate stack structure on a semiconductor substrate;
   defining regions to be isolated and removing a portion of said interlayer material layer and a portion of said semiconductor substrate in said regions, so as to form trenches;
   removing portions of said semiconductor substrate which carry said gate stack structure in said regions; and
   filling said trenches with an insulating material to form isolation regions.

2. The method according to claim 1, characterized in that the removing operation is performed by an isotropic etching process or a passivation process.

3. The method according to claim 1, characterized in that said interlayer material layer is made of the same material.

4. The method according to claim 1, characterized in that said interlayer material layer is a semiconductor layer.

5. The method according to claim 4, characterized in that the method further comprises:
   forming a metal layer covering said interlayer material layer; and
   performing a thermal processing operation to convert said interlayer material layer into a conductive layer.

6. A method for forming a semiconductor device, comprising:
   forming at least one gate stack structure base extending along a first direction and an interlayer material layer between said gate stack structure base on a semiconductor substrate;
   defining regions to be isolated and removing a portion of said interlayer material layer and a portion of said semiconductor substrate in said regions, so as to form trenches;
   removing portions of said semiconductor substrate which carry said gate stack structure base in said regions;
   filling said trenches with an insulating material to form isolation regions; and
   forming gate stack structures based on said gate stack structure base and cutting said gate stack structure along a second direction which is different from said first direction.

7. The method according to claim 6, characterized in that the removing operation is performed by an isotropic etching process or a passivation process.

8. The method according to claim 6, characterized in that said interlayer material layer is made of the same material.

9. The method according to claim 6, characterized in that said interlayer material layer is a semiconductor layer.

10. The method according to claim 9, characterized in that the method further comprises:
    forming a metal layer covering said interlayer material layer; and
    performing a thermal processing operation to convert said interlayer material layer into a conductive layer.

11. A semiconductor device, wherein a plurality of said semiconductor devices are isolated by isolation regions which are embedded into a semiconductor substrate, characterized in that said semiconductor device comprises an interlayer material layer and at least one gate stack structure, wherein said gate stack structure is formed on said semiconductor substrate, and portions of the gate stack structure are located on said isolation regions, and wherein upper surface of said gate stack structure at said isolation regions is lower than upper surface of said gate stack structure between said isolation regions, and said interlayer material layer is located between said gate stack structure.

12. The semiconductor device according to claim 11, characterized in that said interlayer material layer is formed on the upper surface of said gate stack structure at said isolation regions.

13. The semiconductor device according to claim 11, characterized in that for PMOS and NMOS devices, said interlayer material layer is made of the same material.

14. The semiconductor device according to claim 11, characterized in that said interlayer material layer is a semiconductor layer or a conductive layer.

* * * * *